United States Patent
Yosomiya

(10) Patent No.: US 6,635,827 B2
(45) Date of Patent: Oct. 21, 2003

(54) FLAT CABLE COVERING AND FLAT CABLE USING SAME

(75) Inventor: Takatoshi Yosomiya, Tokyo-to (JP)

(73) Assignee: Dai Nippon Printing Co., Ltd., Tokyo-To (JP)

(*) Notice: Subject to any disclaimer, the term of this patent is extended or adjusted under 35 U.S.C. 154(b) by 0 days.

(21) Appl. No.: 10/162,717

(22) Filed: Jun. 6, 2002

(65) Prior Publication Data
US 2002/0195266 A1 Dec. 26, 2002

(30) Foreign Application Priority Data
Jun. 8, 2001 (JP) ........................................ 2001-173926

(51) Int. Cl.[7] ................................................ H01B 7/08
(52) U.S. Cl. ............................ 174/117 F; 174/117 FF; 174/117 A
(58) Field of Search ...................... 174/117 F, 117 FF, 174/117 A

(56) References Cited

U.S. PATENT DOCUMENTS

| | | | | |
|---|---|---|---|---|
| 4,786,663 A | * | 11/1988 | Miyashita et al. | 524/410 |
| 6,207,735 B1 | * | 3/2001 | Kuma et al. | 524/100 |
| 6,274,225 B1 | * | 8/2001 | Miyake et al. | 428/209 |
| 6,316,104 B1 | * | 11/2001 | Kumakura | 428/375 |
| 6,316,532 B1 | * | 11/2001 | Nozaki et al. | 524/100 |
| 2001/0020537 A1 | * | 9/2001 | Ueno et al. | 174/68.1 |

FOREIGN PATENT DOCUMENTS

| JP | 5-314824 | * 11/1993 |
|---|---|---|
| JP | 6-176629 | * 6/1994 |

\* cited by examiner

Primary Examiner—Chau N. Nguyen
(74) Attorney, Agent, or Firm—Sughrue Mion, PLLC

(57) ABSTRACT

An adhesivity improving layer 2, and a flame-retardant heat-adhesive resin layer 3 comprising from 80 to 60 wt. % filler constituents mainly comprising a mixed flame retardant which comprises from 20 to 40 wt. % heat-adhesive resin mainly comprising a linear saturated polyester resin, and at least a hydrated metal compound, antimony oxide and a nitrogen compound, are sequentially laminated on one side of a heat-resistant substrate film 1, thereby preparing a flat cable covering 10. A flat cable is manufactured by placing the coverings 10 one on top of the other on both sides of a plurality of conductors 4 to 4 arranged in parallel so that the flame-retardant heat-adhesive resin layers 3 face each other, and heating and pressurizing the same for integration. There is thus provided a flat cable covering which is excellent in heat adhesivity with conductors, self-weldability, conductor embedding property, nonflammability, heat resistance, sliding resistance and environmental adaptability, and a flat cable using the same.

3 Claims, 1 Drawing Sheet

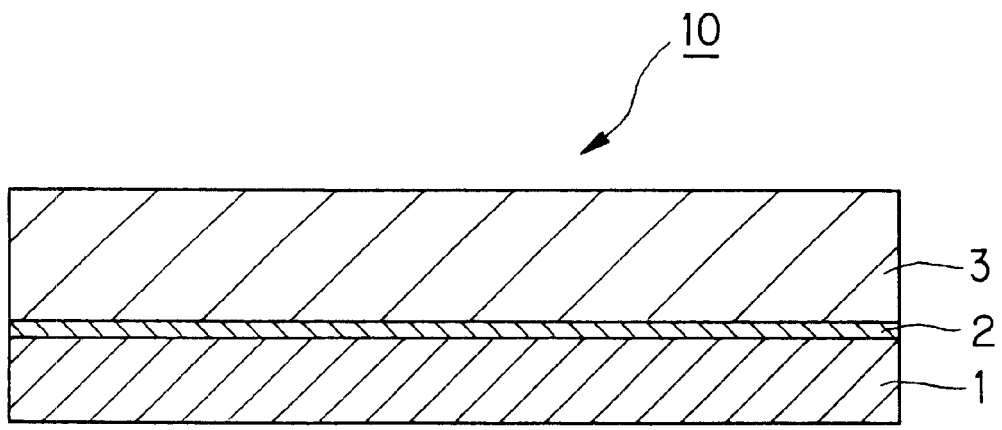
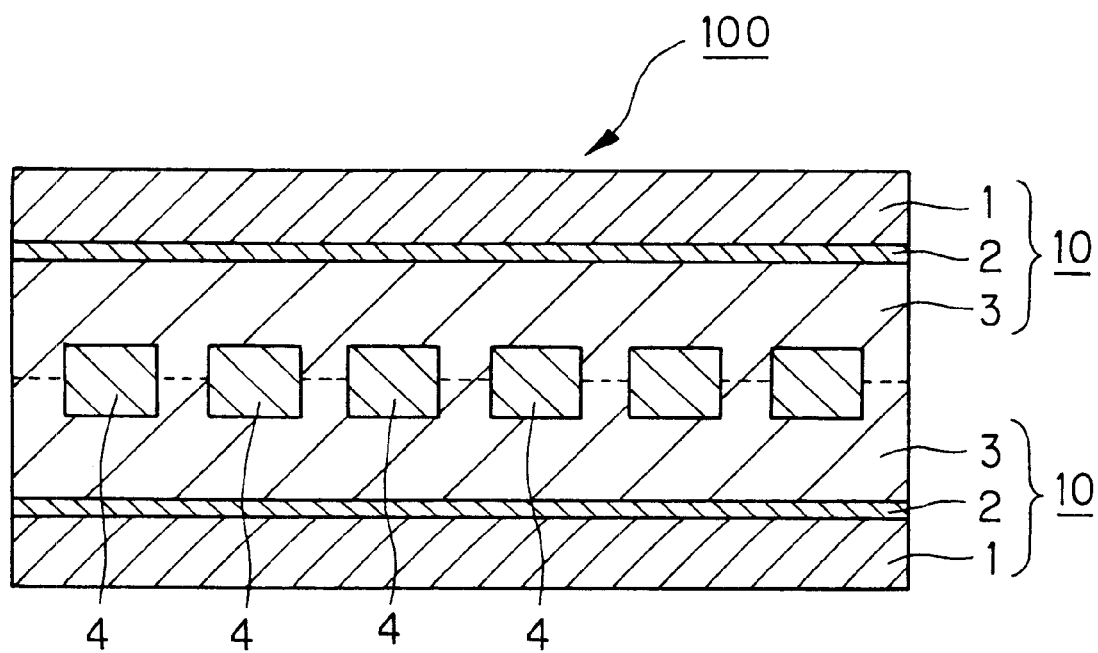

FLAT CABLE COVERING AND FLAT CABLE USING SAME

BACKGROUND OF THE INVENTION

1. Field of the Invention

The present invention relates to a flat cable covering and a flat cable using the same. More particularly, the invention relates to a tape-shaped covering for covering through heat welding so as to embed conductors of a flat cable by holding the same from both sides, which is excellent in heat adhesivity, self-weldability, conductor embedding adaptability, nonflammability, heat resistance, and blocking resistance, and excellent also in environmental adaptability upon disposal or the like, and a flat cable using the same.

2. Description of the Related Art

Flat cables are used in a large quantity at present in various electronic and electric devices and car-mounted devices such as personal computers, liquid crystal display units, game machines, cellular phones, printers and copy machines. Each of these flat cables is generally formed by sequentially laminating a primer coat layer (adhesivity improving layer) or an adhesive layer, and a heat-adhesive resin layer to form a tape-shaped heat-adhesive covering, placing such coverings one on top of the other with the heat-adhesive resin -layer surfaces arranged to face each other, causing them to hold a plurality of conductors in between, and heat and pressurize them for integration.

More specifically, there is known a polyvinyl chloride flat cable manufactured by, for example, laminating polyvinyl chloride resin films serving as heat-adhesive resin layers by the dry lamination method on a side of a substrate film comprising a biaxially oriented polyester film to prepare heat-adhesive coverings, placing these heat-adhesive coverings so as to cause the polyvinyl chloride resin film surfaces serving as heat-adhesive resin layers to face each other, holding a plurality of conductors in between, then, heating and pressurizing the same by means of a heating roll, melting the polyvinyl resin films to embed the plurality of conductors therein, and heat-welding the polyvinyl chloride resin films.

There is also known a polyester resin flat cable manufactured by forming a heat-adhesive resin layer comprising a resin composition containing a saturated polyester resin and a flame retardant, via a primer coat layer on a side of a substrate film such as a biaxially oriented polyester film or the like, placing the manufactured heat-adhesive coverings one on top of the other so as to cause the heat-adhesive resin layer surfaces to face each other, inserting a plurality of conductors, then, heating and pressurizing the same by means of a heating roll, melting the heat-adhesive resin layer to embed the plurality of conductors therein, and causing heat-welding of the heat-adhesive resin layers.

However, although the above-mentioned polyvinyl chloride flat cable is popularly used because of an excellent non-flammability, a film made of a polyvinyl chloride resin forming the heat-adhesive resin layer is low in adhesivity with conductors. Particularly in a high-temperature environment, it poses a problem in that gaps are produced between the film and the conductors, thus causing interlayer peeling. In addition, the afore-mentioned polyvinyl chloride flat cable is poor in bending resistance as a result of the low adhesivity with the conductors. For example, in a bending test or a sliding test, it poses another problem in that the conductors are broken in a very short period of time. Still another problem is that use of the polyvinyl chloride resin film may lead to environmental destruction during disposal after use.

Because the above-mentioned polyester resin flat cable uses a biaxially oriented polyester film as a substrate film, and furthermore, a polyester resin is used as a heat-adhesive resin layer, the cable is poor in non-flammability, and as a result, it is necessary to impart non-flammability by adding a flame retardant in a large quantity to the resin composition forming the heat-adhesive resin layer.

More recently, however, in view of the fact that the use of a filler constituents containing a flame retardant comprising a halogen flame retardant or an organic or inorganic phosphorus compound may cause an environmental problem such as atmospheric pollution or river water pollution during use of the flat cables, or disposal thereof after use, it has become necessary to develop a flame retardant not containing a halogen-based or phosphorus-based flame retardant.

The present invention was developed to solve these problems, and has an object to provide a flat cable covering which is excellent in various properties as a flat cable covering such as heat-adhesivity with a conductor (metal), self-weldability, conductor embedding property, non-flammability, heat resistance, blocking resistance, sliding resistance (bending resistance), does not contain a compound containing a halogen element or a phosphorus-based compound in the constituents, and is excellent in environmental adaptability, and a flat cable using the same.

SUMMARY OF THE INVENTION

The aforementioned problems can be solved by the present invention described in the following paragraphs.

More particularly, a first aspect of the invention provides a flat cable covering, having a configuration in which an adhesivity improving layer, a flame-retardant heat-adhesive resin layer comprising a heat-adhesive resin containing a filler which contains a flame retardant, sequentially laminated on at least one side of a heat-resistant substrate film; wherein the heat-adhesive resin mainly comprising a linear saturated polyester resin, and the flame retardant is a mixed-type flame retardant containing at least a hydrated metal compound, antimony oxide and a nitrogen compound.

For the purpose of providing various necessary properties and improve environmental adaptability, the flat cable covering of the invention has a configuration except for a compound containing a halogen element and a compound containing phosphorus. As the heat-adhesive resin, a resin mainly comprising a linear saturated polyester resin, not a polyvinyl chloride resin is used. By excluding flame retardants of chlorine-based, bromine-based and other halogen-based compounds and by using at least a mixed flame retardant comprising a hydrated metal compound, antimony oxide, and a nitrogen compound, it is possible to impart properties such as heat adhesivity necessary for a covering and effective non-flammability.

By adopting the aforementioned configuration, it is possible to provide a flat cable covering in which the heat-resistant substrate film has high heat resistance, insulation, flexibility, bending resistance, and mechanical strength; the adhesivity improving layer ensures solid adhesion between the heat-resistant substrate film and the flame-retardant heat-adhesive resin layer; and the flame-retardant heat-adhesive resin layer imparts various properties necessary as a flat cable covering such as heat adhesivity with conductors, self-weldability, conductor embedding property, non-flammability, blocking resistance, and sliding resistance, with an excellent environmental adaptability.

A second aspect of the invention provides a flat cable covering according to that recited in the first aspect of the invention as described above, in which the content of the filler containing the flame retardant in the flame-retardant heat-adhesive resin in which a range of from 60 to 80 wt. %; the filler containing the flame retardant has a content of the hydrated metal component within a range of from 30 to 45 wt. %, a content of antimony oxide within a range of from 10 to 30 wt. %, and a content of a nitrogen compound within a range of from 2 to 10 wt. %.

From among the above-mentioned fillers containing flame retardants, at least one of hydrated metal compounds, antimony oxide and nitrogen compounds is used. Apart from this, a flame retardant other than the above, or an organic or inorganic filler such as a blocking inhibitor may be appropriately selected and used, so far as it does not contain a halogen element or phosphorus.

The content of the filler containing the flame retardant in the flame-retardant heat-adhesive resin layer should preferably be within a range of from 60 to 80 wt. % relative to the resin layer as a whole. A filler content of under 60 wt. % or over 80 wt. % is not desirable, because a content of under 60 wt. % leads to shortage of nonflammability, and a content of over 80 wt. % results in a decrease in heat adhesivity.

Among fillers containing the flame retardants, the contents of the hydrated metal compound, antimony oxide and the nitrogen compound relative to the resin layer as a whole should preferably be such that, within a range of from 30 to 45 wt. % for the hydrated metal compound; from 10 to 30 wt. % for antimony oxide; and from 2 to 10 wt. % for the nitrogen compound. The hydrated metal compound has a remarkable flame retarding effect, but an excessively high content impairs heat adhesivity. It should therefore be preferably up to 45 wt. %. Antimony oxide, which cannot give a remarkable flame retarding effect by itself, but is excellent in effect as a flame retarding assistant. It should therefore preferably be contained within a range of up to 30 wt. %. The nitrogen compound, which has an important effect but is high in cost. It is therefore effective to use the nitrogen compound within a range of up to 10 wt. %, preferably simultaneously with the above-mentioned hydrated metal compound. A combination of at least flame retardants such as a hydrated metal compound, antimony oxide, and a nitrogen compound provides an excellent flame retarding effect.

When the contents of the hydrated metal compound, antimony oxide and the nitrogen compound are under the specified ranges, respectively, there is unavailable a sufficient nonflammability.

From the point of view of flame retarding effect and working adaptability, the particle size of these flame retardants should preferably be within a range of from 0.01 to 15 μm in all cases.

By adopting the aforementioned configuration, therefore, it is possible to impart certainly a satisfactory nonflammability to the flat cable covering in addition to the advantages of the invention as described in the first aspect of the invention, without decreasing the properties other than nonflammability.

A third aspect of the invention provides a flat cable covering according to that recited in the first and second aspects of the invention as described above, in which the hydrated metal compound of the flame retardant is aluminum hydroxide; antimony oxide is antimony trioxide; and the nitrogen compound is melamine sulfate.

Among the above-mentioned hydrated metal compound, antimony oxide, and the nitrogen compound serving as flame retardants, aluminum hydroxide as a hydrated metal compound, antimony trioxide as an antimony oxide, and melamine sulfate as a nitrogen compound are particularly preferable because of the possibility to provide more remarkable flame retarding advantage with slight contents, respectively.

By adopting this configuration, therefore, it is possible to achieve a more excellent nonflammability of the flat cable covering in addition to the advantages of the invention as described as to the first and second aspects of the invention.

A fourth aspect of the invention provides a flat cable wherein flat cable coverings according to any one of the first to third aspects of the invention are placed one on top of the other on both sides of each of a plurality of conductors arranged in parallel with each other so that surfaces of the flame-retardant heat-adhesive layer face each other, and the flat cable is formed by heat-bonding so as to embed the conductors through heating and pressurizing from outside.

By adopting this configuration, it is possible to provide at a high productivity a flat cable which is excellent in properties necessary as a flat cable such as sliding resistance (bending resistance), heat resistance, nonflammability, and insulation, and in environmental adaptability, since excellent properties as a flat cable covering and environmental adaptability are imparted to the flat cable.

BRIEF DESCRIPTION OF THE DRAWINGS

FIG. 1 is a schematic sectional view illustrating the configuration of an embodiment of the flat cable covering of the present invention; and FIG. 2 is a schematic sectional view illustrating the configuration of an embodiment of a flat cable manufactured by using the flat cable covering of the invention.

DESCRIPTION OF THE PREFERRED EMBODIMENT

Embodiments of the present invention will now be described in detail with reference to the drawings.

The flat cable covering 10 shown in FIG. 1 is formed by sequentially laminating an adhesivity improving layer 2, and a flame-retardant heat-adhesive resin layer 3 on a side of a heat-resistant substrate film 1.

The above-mentioned heat-resistant substrate film 1 should preferably be excellent in heat resistance and bending property, as well as mechanical properties, size stability, chemical resistance, solvent resistance and electric insulation. Applicable materials include, for example, polyesters such as polyethyleneterephthalate, polybutyleneterephthalate, polyethylenenaphthalate, and polytetramethyleneterephthalate polyolefins such as polypropyele, and ethylene-propylene copolymer; nylon 12, nylon 6, nylon 66; polyamides such as aromatic polyamide; plyimides such as polyamideimide, polyetherimide; polyethersulfon, polyetherketone, polyphenylenesulfide, polyallylate, and polyesterether, in the form of a non-oriented or oriented film. A biaxially oriented polyethyleneterephthalate film is particularly preferable because of excellent properties as described above, easy film forming, and economic merits.

The above-mentioned heat-resistant substrate film 1 has usually a thickness of from 5 to 200 μm. It is desirable to apply an adhesion intensifying treatment such as corona discharge treatment, plasma treatment or ozone treatment to the side of the heat-resistant substrate film 1 having the adhesivity improving layer 2 and the flame-retardant heat-adhesive resin layer 3.

The adhesivity improving layer 2 is previously provided on the lamination surface of the heat-resistant substrate film 1, upon laminating the flame-retardant heat-adhesive resin layer 3 onto the heat-resistant substrate film 1 by coating or the like, for the purpose of improving adhesivity thereof, and can be formed by coating the following coating liquid of an adhesivity improving agent onto the heat-resistant substrate film 1 and drying the same.

An adhesivity improving agent can be selected from the group consisting, for example, of polyethyleneimine, organic titanium compounds, polyolefin-based compounds, polybutadiene-based compounds, isocyanate-based compounds, polyesterurethane compounds and polyetherurethane compounds, taking into account adhesion adaptability between the heat-resistant substrate film 1 and the flame-retardant heat-adhesive resin layer 3 and operability.

Particularly in the present invention, it is desirable to use a two-component curing type adhesivity improving agent containing polyol which provides a high heat resistance at the adhering portion and is curable at a low temperature within a range of from 30 to 40° C. after coating and drying the solvent, as a main constituent, using isocyanate as a curing agent, because this permits improvement of heat resistance and adhesivity.

As a main constituent of the above-mentioned adhesivity improving agent, applicable materials include polyester-polyols synthesized from a diol constituent such as ethyleneglycol, diethyleneglycol, dipropyleneglycol, 1,4-butanediol, 1,6-hexanediol, and neopentylglycol, and a dibasic acid constituent such as adipic acid, azelaic acid, sebacic acid, isophthalic acid, and terephthalic acid and denatured products thereof; polyetherpolyols such as polyethyleneglycol, polyoxypropyleneglycol, and polytetramethyleneetherglycol and denatured products thereof; and low molecular weight polyols such as ethyleneglycol, diethyleneglycol, dipropyleneglycol, 1,4-butanediol, 1,6-hexanediol, neopentypglycol, and trimethylpropane.

Applicable curing agents for the adhesivity improving agent include isocyanate monomers such as trylenediisocyanate, diphenylmethanediisocyanate, hexamethylenediisocyanate, isophoronediisocyanate, tris-(isocyanatephenyl), and methane-tris(isocyanatephenyl) thiophosphate; urethaneprepoplymers prepared by adding in isocyanate monomer to trimethylpropane such as trylenediisocyanate and hexamethylenediisocyanate; and isocyanate denatured products such as hexamethylenediisocyanate burette, hexamethylenediisocyanate and isophoronediisocyanate trimer.

As an assistant for further improving the adhesion strength, heat-resistant adhesivity and reaction rate of the aforementioned adhesivity improving agent, a titanium coupling agent, a silane coupling agent, or an inorganic filler may be added. A coating liquid may be prepared by appropriately adding a solvent such as ethyl acetate, methylethylketone or isopropylalcohol to such an adhesivity improving agent and coated onto the heat-resistant substrate film 1 by coating means such as the roll coating method, the reverse roll coating method, the gravure coating method or the gravure reverse coating method, and dried, thereby forming the adhesivity improving layer 2. The thus formed adhesivity improving layer 2 should preferably have a small thickness of about 0.1 to 5 µm.

The flame-retardant head-adhesive resin layer 3 is formed by a resin composition layer prepared by adding a flame-retardant agent, a filler and the like to a heat-resistant resin. There is no restriction imposed on the forming method. It may be formed, for example, by adding a flame retardant, a filler and the like to a heat-adhesive resin solution to prepare a coating liquid, coating the thus prepared coating liquid onto the above-mentioned adhesivity improving layer 2, using known coating means and drying the same. When the flame-retardant heat-adhesive resin layer 3 is thick, coating may be accomplished in several runs.

The heat-adhesive resin used for the flame-retardant heat-adhesive resin layer 3 must fix the flame retardant, have heat-adhesivity with a conductor, self-weldability and conductor embedding property, and have blocking resistance. For this purpose, it is desirable to use a resin mainly comprising a linear saturated polyester-based resin.

The linear saturated polyester-based resin is a polyester-based resin obtained through polycondensation of the aromatic or aliphatic saturated dibasic acid such as terephthalic acid or adipic acid and a dihydric alcohol such as ethyleneglycol or 1,4-butanediol, preferably having a glass transition point within a range of from −50 to 80° C. and a weight average molecular weight of from 7,000 to 50,000. As required, a heat-adhesive resin can be formed by appropriately adding a polyester-based polymer plasticizer.

The flame retardant to be contained in the above-mentioned heat-adhesive resin does not contain a halogen element or phosphorus. A hydrated metal compound such as aluminum hydroxide or magnesium hydroxide, an antimony oxide such as antimony trioxide or antimony pentoxide, a melamine compound such as melamine sulfate, and a nitrogen compound such as urea, triazine, isocyanulate, guanidine compound are used in combination. Apart from the above, for example, silica, boron, zinc borate, antimony borate, antimony molybdate, molybdenum oxide, calcium-aluminum silicate, zirconium compound, tin compound, dowsonite, hydrated calcium aluminate, zinc stannate, copper oxide, metal copper powder, calcium carbonate, barium metaborate, ferrocene, fumaric acid, and maleic acid may be appropriately selected and used.

The content of the filler containing the flame retardant in the above-mentioned flame-retardant heat-adhesive resin layer 3 should preferably be within a range of from 60 to 80 wt. % relative to the entire resin layer. A filler content of under 60 wt. % leads to an insufficient nonflammability, and a content of over 80 wt. % results in a decrease in heat adhesivity.

As described above, the content of the hydrated metal compound in the filler containing the flame retardant should preferably be within a range of from 30 to 45 wt. % relative to the entire resin layer (the same applies hereafter); the content of antimony oxide, within a range of from 10 to 30 wt. %; and the content of the nitrogen-based compound, within a range of from 2 to 10 wt. %. Although the hydrated metal compound itself does not exert a remarkable flame retardant effect, it should preferably be contained in an amount of up to 30 wt. % because of the excellent action as a flame-retardant assistant. The nitrogen compound can exert an important flame retardant effect, but because of the high cost, it is effective to use it in an amount within a range of up to 10 wt. %, simultaneously with the above-mentioned hydrated metal compound. By using at least the hydrated metal compound, antimony oxide, and the nitrogen-based compound in combination as flame retardants, as described above, an excellent flame retardant effect is available.

When the contents of the hydrated metal compound, antimony oxide and the nitrogen-based compound are under the specified ranges, respectively, a sufficient nonflammability is unavailable.

From the point of view of flame retardant effect and working adaptability, these flame retardants should preferably have a particle size within a range of from about 0.01 to 15 μm.

The thickness of the flame-retardant heat-adhesive resin layer 3, which may appropriately be selected in view of the thickness of the conductors (metal cable) to be covered, the use and the environment, is selected to as to keep an adhesion strength with the metal cable and follow bending. It is usually 0.1 to 2 times as large as the thickness of the metal cable, and may be within a range, for example, of from 20 to 100 μm.

FIG. 2 is a schematic sectional view illustrating the configuration of an embodiment of the flat cable manufactured by use of the flat cable covering of the present invention, that is, a schematic sectional view illustrating the configuration of a flat cable manufactured by use of the flat cable covering 10 having the configuration shown in FIG. 1.

More specifically, in the flat cable 100 shown in FIG. 2, on the both sides of a plurality of conductors (metal cables) 4 to 4 arranged in parallel at the center, flat cable coverings 10 and 10 having a configuration in which the heat-resistant substrate film 1, the adhesivity improving layer 2, and the flame-retardant heat-adhesive resin layer 3 are sequentially laminated as shown in FIG. 1, are placed one on top of the other so that the flame-retardant heat-adhesive resin layers 3 and 3 face each other. The flame-retardant heat-adhesive resin layers 3 and 3 are melted by heating and pressurizing by means of a heating roll or the like from outside to embed therein the plurality of conductors 4 to 4, and the flame-retardant heat-adhesive resin layers 3 and 3 are integrated through heat welding. The flat cable can be thus manufactured.

EXAMPLES

The present invention will be described further in detail by means of examples.

Example 1

Manufacture of Flat Cable Covering

A 25 μm-thick biaxially oriented polyethyleneterephthalate film (of which one side is treated by corona-dischargement) was used as the heat-resistant substrate film 1. A resin composition solution mainly comprising a heat-curable polyester-based resin was coated so as to achieve a dry thickness of 1 μm and dried, thereby forming an adhesivity improving layer (primer layer) 2. Then, a flame-retardant heat-adhesive resin layer coating liquid having the following composition was coated so as to achieve a dry thickness of 35 μm, and dried, thereby forming a flame-retardant heat-adhesive layer 3 to manufacture a flat cable covering hading the configuration shown in FIG. 1:

| (Composition of flame-retardant heat-adhesive resin layer coating liquid) | |
|---|---|
| (1) Linear saturated polyester-based resin (glass transition point: 12° C.): | 30 wt. parts |
| (2) Flame retardant aluminum hydroxide (average particle size: 1 μm): | 35 wt. parts |
| (3) Flame retardant antimony trioxide (average particle size: 0.5 μm): | 24 wt. parts |
| (4) Flame retardant melamine sulfate: | 10 wt. parts |

| -continued | |
|---|---|
| (Composition of flame-retardant heat-adhesive resin layer coating liquid) | |
| (5) Other filler silica: | 1 wt. part |
| (6) Solvent (toluene/methylethylketone weight ratio: 10/28): | 150 wt. parts |

Manufacture of Flat Cable

The flat cable coverings of Example 1 were arranged so that the flame-retardant heat-adhesive resin layers face each other, and 15 copper cables having a width of 1.0 mm and a thickness of 0.05 mm and having a tin-plated surfaces were inserted at intervals of 1 mm as conductors (metal cables) therein. The assembly was passed through two heating rubber rolls rotating at a surface speed of 3 m/min, and heated and pressurized to melt the flame-retardant heat-adhesive resin layers on both sides. The assembly was heat-welded for integration so as to embed the conductors therein. The same was pressure-bonded between a chill roll and a rubber roll, and then cooled, thereby manufacturing the flat cable of Example 1. The above-mentioned heating rubber roll had a roll temperature of 180° C.

For the flat cable covering of Example 1 manufactured as described above, and the flat cable manufactured by using the covering, heat adhesivity of the flame-retardant heat-adhesive resin layer with the conductors (metal) and conductor embedding property were tested or investigated. A satisfactory result was obtained in all cases.

A sliding resistance test was carried out by repeatedly bending the cable in a energized state, and measuring the number of sliding before breakage. A satisfactory result was obtained.

The nonflammability of the flat cable passed a nonflammability test performed in accordance with UL standard VW-1.

Since a compound containing a halogen element or phosphorus is not used as component material, the flat cable clearly provides a higher safety also in terms of environmental adaptability.

According to the present invention, there is provided a tape-shaped flat cable covering which covers flat cable conductors (metal cables) by heat-bonding from both sides so as to embed the conductors. The covering is excellent in properties necessary as a flat cable covering such as heat-adhesivity with conductors (metal), self-weldability, conductor embedding adaptability, heat resistance, nonflammability, and bending resistance (sliding resistance). Since the component materials do not contain a compound containing a halogen element or phosphorus compound, it does not exert an adverse effect on environment such as atmospheric pollution and water pollution, thus providing a flat cable covering excellent also in environmental adaptability and a flat cable manufactured by use thereof excellent in the above-mentioned properties and in environmental adaptability.

What is claimed is:

1. A flat cable covering, having a configuration in which an adhesivity improving layer, a flame-retardant heat-adhesive resin layer comprising a heat-adhesive resin containing a filler which contains a flame retardant, sequentially laminated on at least one side of a heat-resistant substrate film; wherein said heat-adhesive resin mainly comprising a linear saturated polyester resin, and said flame retardant is a mixed-type flame retardant containing at least a hydrated metal compound, antimony oxide and a nitrogen compound; and wherein the content of the filler containing the flame retardant in the flame-retardant heat-adhesive resin is within a range of from 60 to 80 wt. %; the filler containing said flame retardant has a content of the hydrated metal compound within a range of from 30 to 45 wt. %, a content of antimony oxide within a range of from 10 to 30 wt. %, and a content of a nitrogen compound within a range of from 2 to 10 wt. %.

2. A flat cable covering according to claim 1, wherein the hydrated metal compound of the flame retardant is aluminum hydroxide; antimony oxide is antimony trioxide; and the nitrogen compound is melamine sulfate.

3. A flat cable, wherein said flat cable coverings according to claim 1 are placed one on top of the other on both sides of each of a plurality of conductors arranged in parallel with each other so that the flame-retardant heat-adhesive layer face each other in the surfaces, and heat-bonded so as to embed the conductors in said flat cable coverings.

* * * * *